(12) United States Patent
Lee et al.

(10) Patent No.: US 9,608,107 B2
(45) Date of Patent: Mar. 28, 2017

(54) METHOD AND APPARATUS FOR MOS DEVICE WITH DOPED REGION

(71) Applicant: Vanguard International Semiconductor Corporation, Hsinchu (TW)

(72) Inventors: Tsung-Hsiung Lee, Taoyuan (TW); Shin-Cheng Lin, Tainan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/192,097

(22) Filed: Feb. 27, 2014

(65) Prior Publication Data

US 2015/0243783 A1    Aug. 27, 2015

(51) Int. Cl.
| | |
|---|---|
| H01L 29/78 | (2006.01) |
| H01L 29/40 | (2006.01) |
| H01L 29/10 | (2006.01) |
| H01L 29/06 | (2006.01) |
| H01L 29/66 | (2006.01) |
| H01L 29/08 | (2006.01) |
| H01L 29/423 | (2006.01) |

(52) U.S. Cl.
CPC ...... *H01L 29/7835* (2013.01); *H01L 29/0653* (2013.01); *H01L 29/1045* (2013.01); *H01L 29/1087* (2013.01); *H01L 29/402* (2013.01); *H01L 29/407* (2013.01); *H01L 29/66659* (2013.01); *H01L 29/063* (2013.01); *H01L 29/0847* (2013.01); *H01L 29/42368* (2013.01)

(58) Field of Classification Search
None
See application file for complete search history.

(56) References Cited

U.S. PATENT DOCUMENTS

| | | |
|---|---|---|
| 6,168,983 B1 | 1/2001 | Rumennik et al. |
| 6,207,994 B1 | 3/2001 | Rumennik et al. |
| 6,468,847 B1 | 10/2002 | Disney |
| 6,509,220 B2 | 1/2003 | Disney |
| 6,570,219 B1 | 5/2003 | Rumennik et al. |
| 6,639,277 B2 | 10/2003 | Rumennik et al. |
| 8,264,015 B2 | 9/2012 | Eklund |
| 2014/0061788 A1* | 3/2014 | Chen et al. ............ 257/339 |

* cited by examiner

*Primary Examiner* — Shaun Campbell
*Assistant Examiner* — Aneta Cieslewicz
(74) *Attorney, Agent, or Firm* — Finnegan, Henderson, Farabow, Garrett & Dunner LLP

(57) ABSTRACT

A semiconductor device is provided. The device may include a semiconductor layer; and a doped well disposed in the semiconductor layer and having a first conductivity type. The device may also include a drain region, a source region, and a body region, where the source and body regions may operate in different voltages. Further, the device may include a first doped region having a second conductivity type, the first doped region disposed between the source region and the doped well; and a second doped region having the first conductivity type and disposed under the source region. The device may include a third doped region having the second conductivity type and disposed in the doped well; and a fourth doped region disposed above the third doped region, the fourth doped region having the first conductivity type. Additionally, the device may include a gate and a field plate.

20 Claims, 40 Drawing Sheets

Device 10A

Device 10B

Device 20A

Device 20B

Device 30A

Device 30B

Device 40A

Device 40B

Device 50A

Device 50B

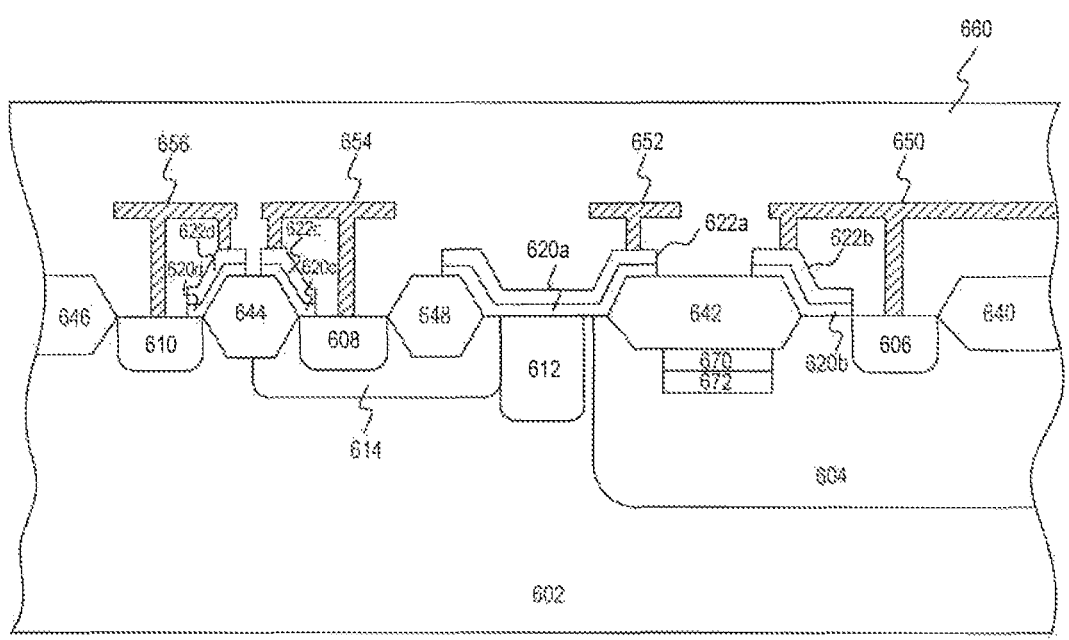
Fig. 6A  Device 60A

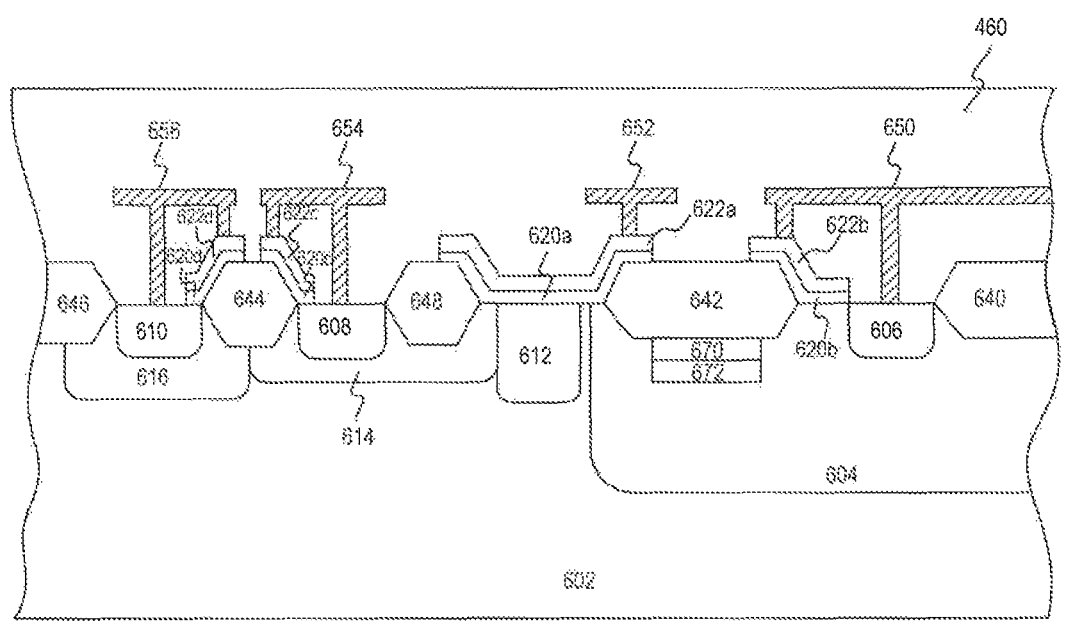
Fig. 6B  Device 60B

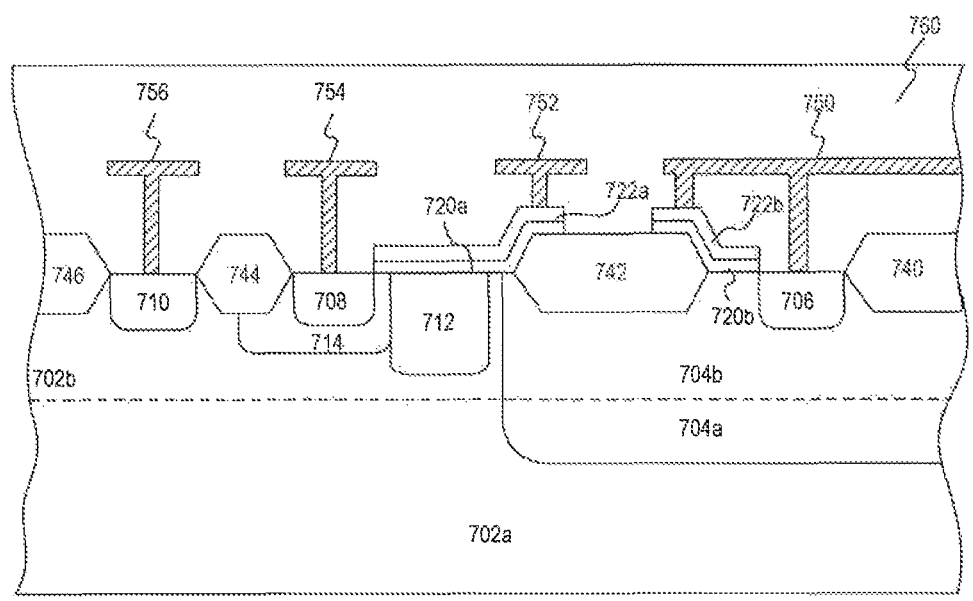
Fig. 7L  Device 10A

Device 20A

Device 30A

METHOD AND APPARATUS FOR MOS DEVICE WITH DOPED REGION

Example embodiments relate to a semiconductor device, and in particular, to a semiconductor device with doped regions and a method for manufacturing the same.

BACKGROUND

Laterally diffused metal-oxide-semiconductor field effect transistor (LDMOSFET) is an important technology for many semiconductor device applications including, for example, radio-frequency (RF), power conversion, power amplification, electrostatic discharge (ESD) and high-voltage applications, in these applications, source and body regions of a LDMOSFET are often connected electrically by, for example, metal layer(s) formed during back-end processes and/or by a heavily-doped semiconductor deep well (often known as a "sinker").

However, an electrical connection between source and body regions makes it difficult to establish a differential voltage between the two regions, and reduces flexibilities in device design and applications. Thus, there exists a need in the art for developing a semiconductor device having separated source and body regions, each of which is capable of operating at a different voltage.

SUMMARY

In accordance with some embodiments of this disclosure, a semiconductor device may include a semiconductor layer; and a doped well disposed in the semiconductor layer and having a first conductivity type. The semiconductor device may also include a drain region disposed in the doped well, and a source region and a body region disposed in the semiconductor layer. Further, the semiconductor device may include a first doped region having a second conductivity type, the first doped region disposed between the source region and the doped well; and a second doped region having the first conductivity type and disposed under the source region. In addition, the semiconductor device may include a third doped region having the second conductivity type and disposed in the doped well; and a fourth doped region disposed in the doped well and above the third doped region, the fourth doped region having the first conductivity type.

In various embodiments, the semiconductor device may include one or more of the following features: a fifth doped region having the second conductivity type and disposed under the body region; the first doped region and the fifth doped region having substantially the same doping concentration; the first doped region and the fifth doped region having different doping concentrations; a field plate connected to at least one of the source region, the drain region, or the body region; an insulator disposed on the first doped region, and a conductive member disposed on the insulator; and a field plate connected to the conductive member.

In accordance with some embodiments of this disclosure, a semiconductor device may include a semiconductor layer, and a doped well disposed in the semiconductor layer and having a first conductivity type. The semiconductor device may also include a drain region disposed in the doped well, and a source region and a body region disposed in the semiconductor layer. Further, the semiconductor device may include a first doped region having a second conductivity type, the first doped region disposed between the source region and the doped well. In addition, the semiconductor device may include a second doped region having the first conductivity type and disposed under the source region.

In various embodiments, the semiconductor device may include one or more of the following features; a third doped region having the second conductivity type and disposed under the body region; the first doped region and the third doped region having substantially the same doping concentration; the first doped region and the third doped region having different doping concentrations; a field plate connected to at least one of the source region, the drain region, or the body region; an insulator disposed on the first doped region, and a conductive member disposed on the insulator; and a field plate connected to the conductive member.

In accordance with some embodiments of this disclosure, a method of forming a semiconductor structure may include forming a first doped well having a first conductivity type in a first semiconductor layer having a second conductivity type; and forming a second semiconductor layer having the second conductivity type on the first semiconductor layer. The method may also include forming a second doped well of the first conductivity type in the second semiconductor layer; and forming a first doped region having a second conductivity type in the second doped well. Further, the method may include forming a second doped region having a first conductivity type in the second doped well, the second doped region disposed above the first doped region; and forming a third doped region having a first conductivity type in the second semiconductor layer, the third doped region disposed apart from the second doped well. Still further, the method may include forming a fourth doped region having the second conductivity type in the second semiconductor layer, the fourth doped region is formed between the second doped well and the third doped region. In addition, the method may include forming a fifth doped region having the second conductivity type in the second semiconductor layer, the fifth doped region is disposed apart from the second doped well region and the fourth doped region. Additionally, the method may include forming a first insulator on the fourth doped region; forming a conductive member on the insulator; forming a source region on the third doped region; forming a drain region on the second doped well; and forming a body region on the second semiconductor layer.

In accordance with some embodiments of this disclosure, a method of forming a semiconductor structure may include forming a doped well having a first conductivity type in a semiconductor layer; and forming a first doped region having a second conductivity type in the doped well. The method may also include forming a second doped region having a first conductivity type in the doped well, the second doped region disposed above the first doped region. Further, the method may include forming a third doped region having a first conductivity type in the semiconductor layer, the third doped region disposed apart from the doped well. In addition, the method may include forming a fourth doped region having the second conductivity type in the semiconductor layer, the fourth doped region is formed between the doped well and the third doped region. Additionally, the method may include forming a source region on the third doped region; forming a drain region on the doped well; and forming a body region on the semiconductor layer.

In various embodiments, the method may include one or more of the following features: forming a fifth doped region having the second conductivity type in the semiconductor layer, the fifth doped region disposed under the body region; the steps of forming the fourth doped region and forming the fifth doped region being performed simultaneously; the steps of forming the fourth doped region and forming the fifth doped region being performed in a sequential order, either forming the fourth doped region or the fifth doped region first; the fourth doped region and the fifth doped region having substantially the same doping concentration; the fourth doped region and the fifth doped region having different doping concentrations; forming a field plate connected to at least one of the source region, the drain region, or the body region; forming a first insulator on the fourth doped region, and forming a conductive member on the first insulator; and forming a field plate connected to at least one of the source region, the drain region, the body region, or the conductive member.

In accordance with some embodiments of this disclosure, a method of forming a semiconductor structure may include forming a doped well having a first conductivity type in a semiconductor layer; and forming a first doped region having a first conductivity type in the semiconductor layer, the first doped region disposed apart from the doped well. The method may also include forming a second doped region having the second conductivity type in the semiconductor layer, the second doped region is formed between the doped well and the first doped region. Further, the method may include forming a source region on the first doped region; forming a drain region on the doped well; and forming a body region on the semiconductor layer.

In various embodiments, the method may include one or more of the following features: forming a third doped region having a second conductivity type in the doped well, and forming a fourth doped region having a first conductivity type in the doped well, the fourth doped region disposed above the third doped region; forming a fifth doped region having the second conductivity type in the semiconductor layer, the fifth doped region disposed under the body region; the steps of forming the second doped region and forming the fifth doped region are performed simultaneously; the steps of forming the second doped region and forming the fifth doped region are performed in a sequential order, either forming the second doped region or the fifth doped region first; the second doped region and the fifth doped region having substantially the same doping concentration; the second doped region and the fifth doped region having different doping concentrations; forming a field plate connected to at least one of the source region, the drain region, or the body region; forming a first insulator on the second doped region, and forming a conductive member on the first insulator; and forming a field plate connected to at least one of the source region, the drain region, the body region, or the conductive member.

BRIEF DESCRIPTION OF THE DRAWINGS

Reference will now be made, by way of example, to the accompanying drawings which show example embodiments of the present application, and in which:

FIGS. 6A and 6B show example semiconductor devices consistent with some embodiments of this disclosure;

FIGS. 7A-7L show example methods of manufacturing the devices of FIGS. 1A, 1B, 4A and 4B;

DESCRIPTION OF EXAMPLE EMBODIMENTS

Reference will now be made in detail to the example embodiments, which are illustrated in the accompanying drawings.

Figure 1A:
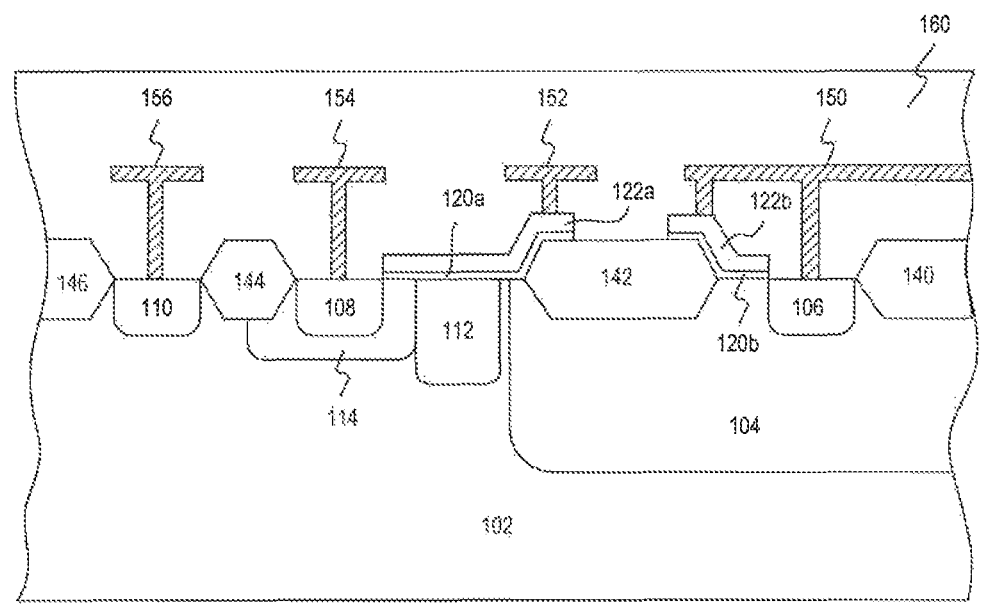
FIGS. 1A and 1B show example semiconductor devices consistent with some embodiments of this disclosure.

Reference is now made to FIG. 1A, which shows an example semiconductor device 10A. Device 10A is an n-type device, which includes a p-type semiconductor layer 102. An n-type doped deep well 104, an n-type source region 108, and a p-type body region 110 are disposed in layer 102. An n-type drain region 106 is disposed in deep well 104. A first p-type doped region ("first region") 112 is disposed between source region 108 and deep well 104. An n-type doped well 114 is disposed under source region 108 and enclosing the same. Deep well 104, first region 112, and well 114 may or not be adjacent to one another.

In some embodiments, an insulator 120$a$ is disposed on layer 102 and above first region 112. Additionally, a conductive member 122$a$ is disposed on insulator 120$a$. Conductive member 122$a$ may, for example, function as a gate to control or modulate conductivity of layer 102 that is underneath insulator 120$a$. Electrically insulating isolations 140, 142, 144, and 146 are disposed in layer 102 to provide, for example, isolation among doped regions, deep wells, layers, members, or adjacent devices. In some embodiments, insulator 120$a$ and conductive member 122$a$ extend onto isolation 142. The extended portion of conductive member 122$a$ may, for example, function as a field plate to reduce the local electric field and increase breakdown voltage of device 10A. Electrically conductive electrodes 150, 152, 154, and 156 are electrically connected to drain region 106, conductive member 122$a$, source region 108, and body region 110 respectively. Electrodes 150, 152, 154, and 156 may be formed of, for example, Al, Cu, AlCu, suitable highly-doped semiconductors, conductors, or metals. An interlayer dielectric layer 160 is disposed to encapsulate device 10A.

In some embodiments, device 10A further includes an insulator 120$b$ that is disposed on layer 102 and isolation 142, and adjacent to drain region 106. Moreover, a conductive member 122$b$ is disposed on insulator 120$b$. Conductive member 122$b$ is electrically connected to drain region 106 via electrode 150. Conductive member 122$b$ may, for example, function as a field plate to reduce the local electric field and increase breakdown voltage of device 10A.

With the above example structures of device 10A, it is possible to have separated source and body regions, each of which capable of operating at a different voltage, to provide additional flexibilities in device design and applications. In some embodiments, the voltage at source region 108 is higher than the voltage at the body region 110 by 1-100V.

Figure 1B:
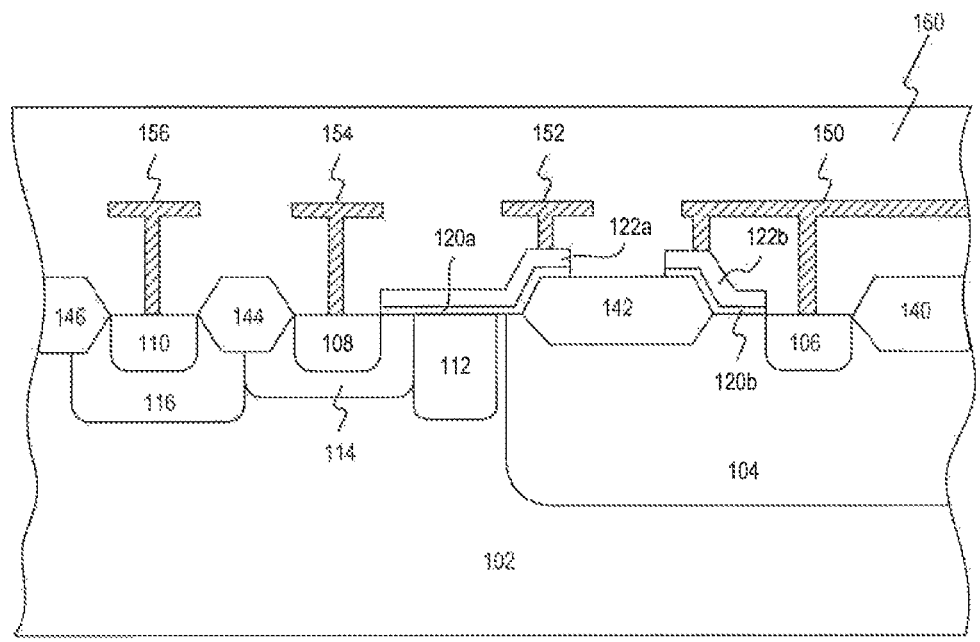

In some embodiments, referring to FIG. 1B which represents a semiconductor device 10B, device 10B includes all elements of device 10A, and further includes a second p-type doped region ("second region") 116 that is disposed under body region 110 and encloses the same.

Figure 2A:
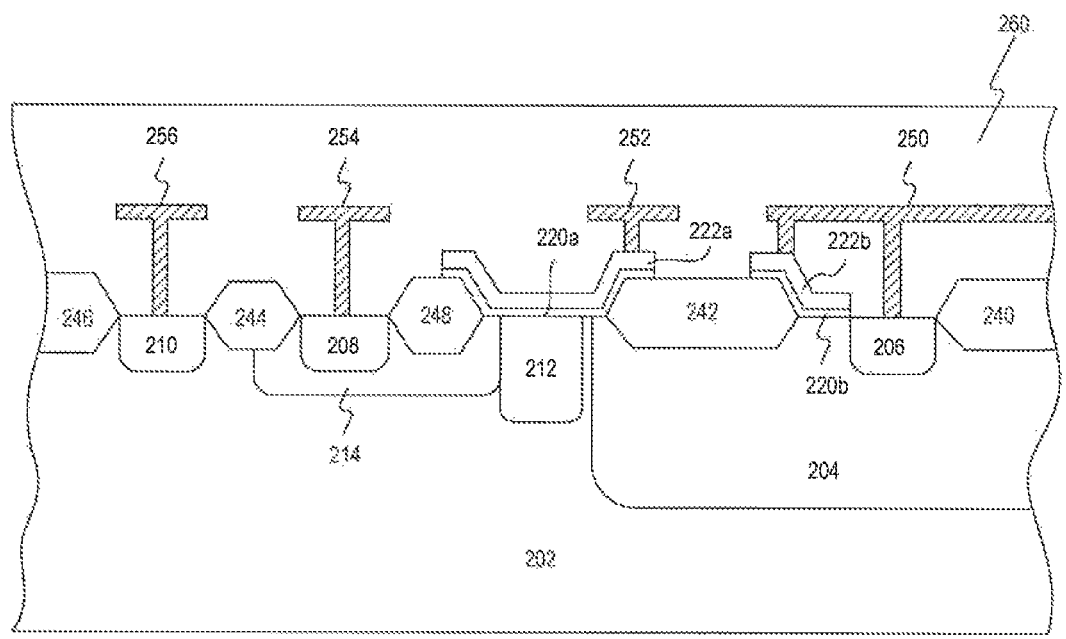
FIGS. 2A and 2B show example semiconductor devices consistent with some embodiments of this disclosure.
Figure 2B:
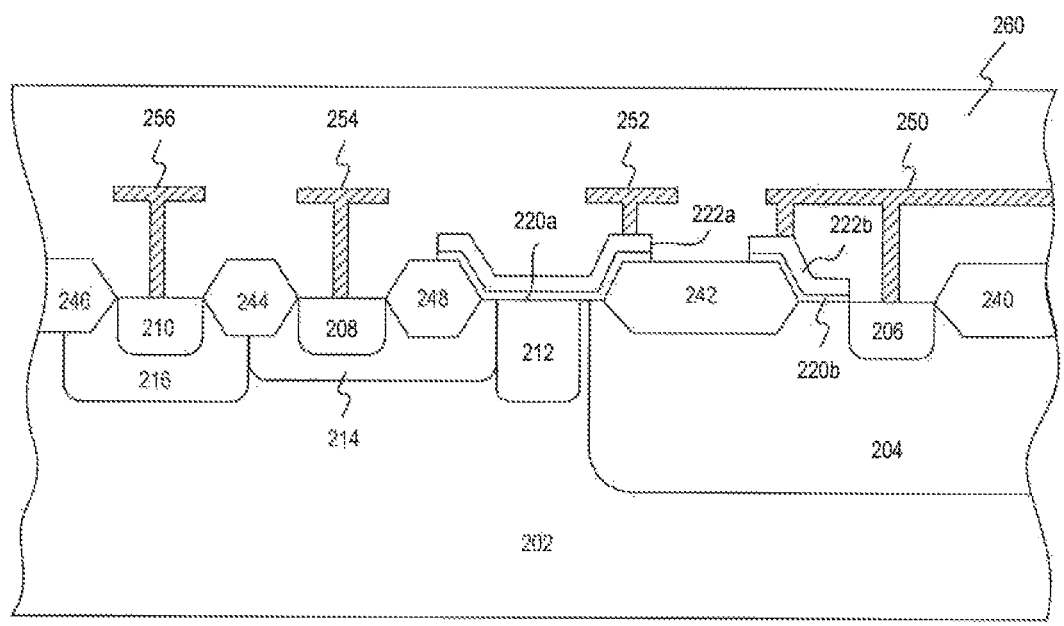

In some embodiments, referring to FIGS. 2A and 2B which represent semiconductor devices 20A and 20B respectively, devices 20A and 20B include all elements of devices 10A and 10B respectively, and further include an isolation 248 that is disposed above a doped well 214, and between a source region 208 and a first p-type doped region ("first region") 212. In some embodiments, an insulator 220a and a conductive member 222a extend onto isolation 248. The extended portion of conductive member 222a may, for example, function as a field plate to reduce the local electric field and increase breakdown voltage of devices 20A and 20B.

Figure 3A:
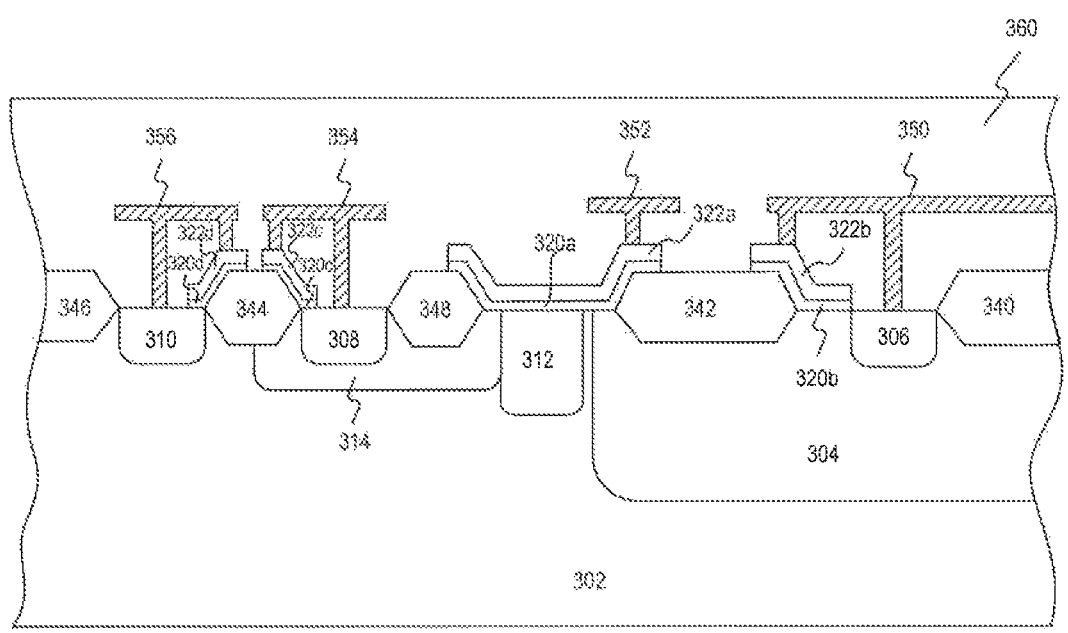
FIGS. 3A and 3B show example semiconductor devices consistent with some embodiments of this disclosure.
Figure 3B:
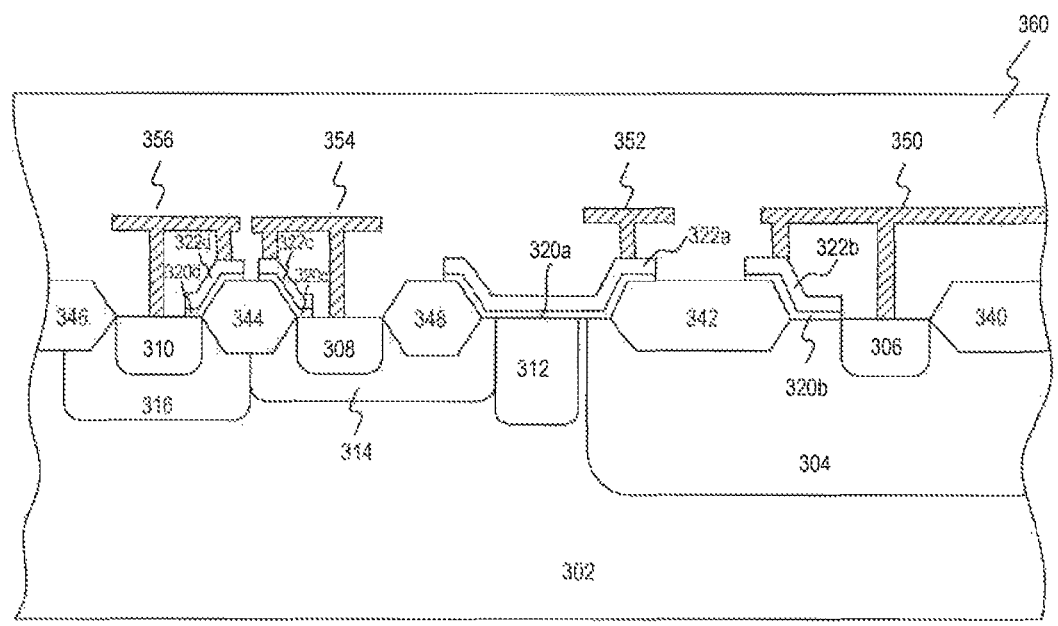

In some embodiments, referring to FIGS. 3A and 3B which represent semiconductor devices 30A and 30B respectively, devices 30A and 30B include all elements of devices 20A and 20B and further include conductive members 322c and 322d that are disposed on insulators 320c and 320d respectively. Insulator 320c is disposed on source region 308. Insulator 320d is disposed on body region 310. In some embodiments, conductive members 322c and insulator 320c, or conductive member 322d and insulator 320d may extend onto isolation 344. Moreover, conductive members 322c or 322d are connected to source region 308 or body region 310 via electrodes 354 or 356 respectively. The extended portion of conductive member 322c or 322d may, for example, function as a field plate to reduce the local electric field and increase breakdown voltage of devices 30A and 30B.

Figure 4A:
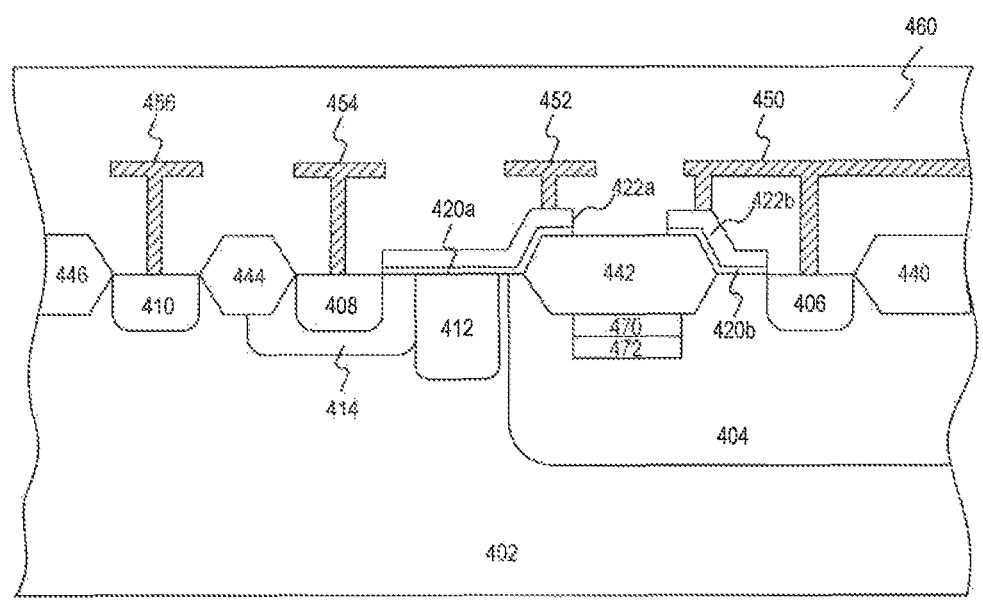
FIGS. 4A and 4B show example semiconductor devices consistent with some embodiments of this disclosure.
Figure 4B:
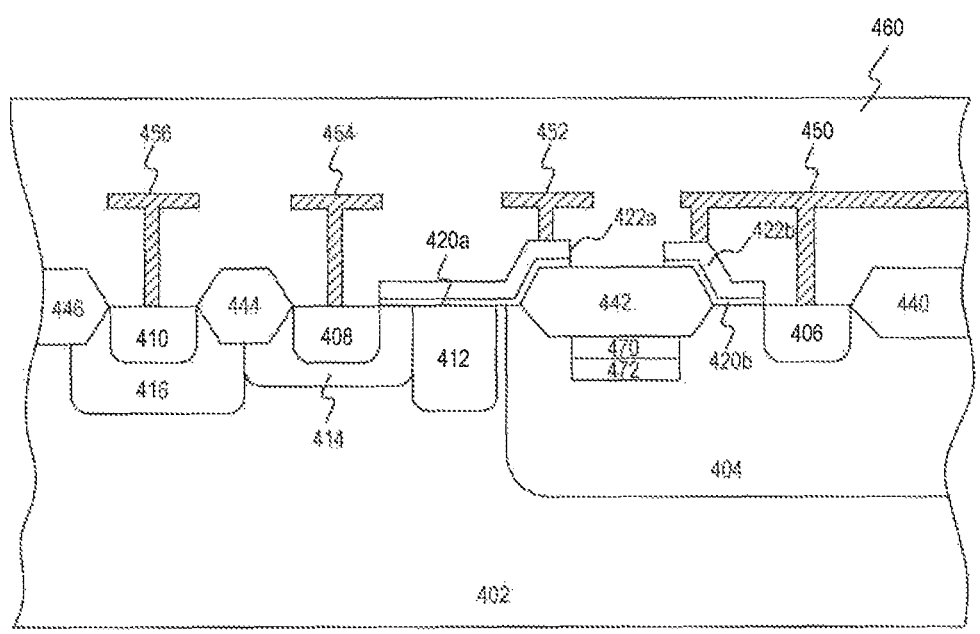

Referring to FIGS. 4A and 4B which respectively represent semiconductor devices 40A and 40B, devices 40A and 40B include all elements of devices 10A and 10B. In addition, each of devices 40A and 40B further includes an n-type doped region 470 and a p-type doped region 472, both of which are disposed in an n-type doped deep well 404, where region 470 is disposed above region 472. Regions 470 and 472 may increase breakdown voltage of devices 40A and 40B and at the same time to reduce the ON-resistance of the devices.

Figure 5A:
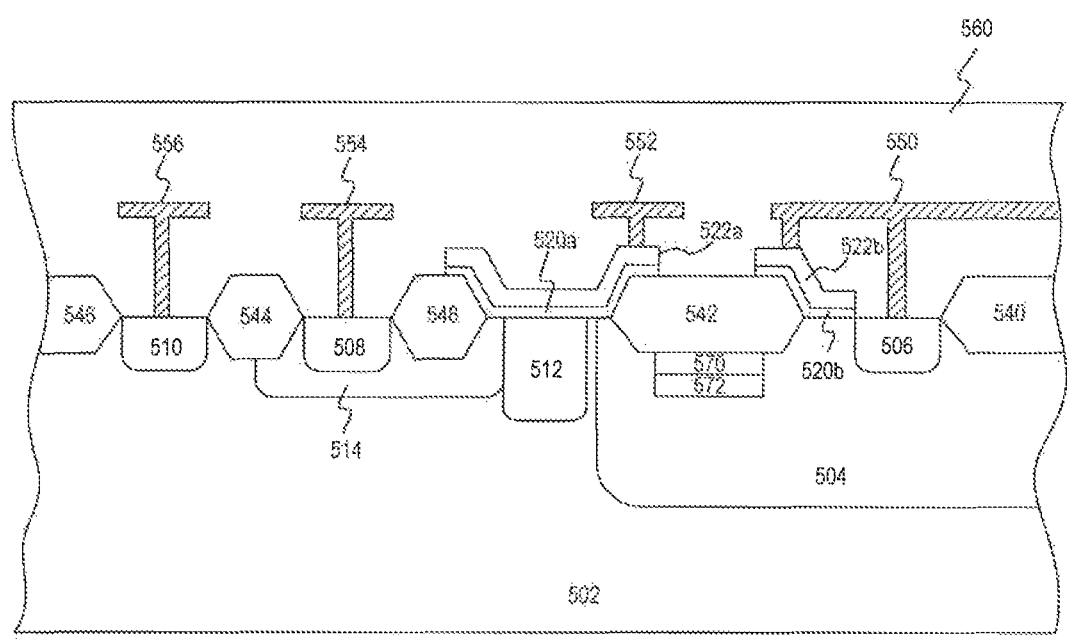
FIGS. 5A and 5B show example semiconductor devices consistent with some embodiments of this disclosure.
Figure 5B:
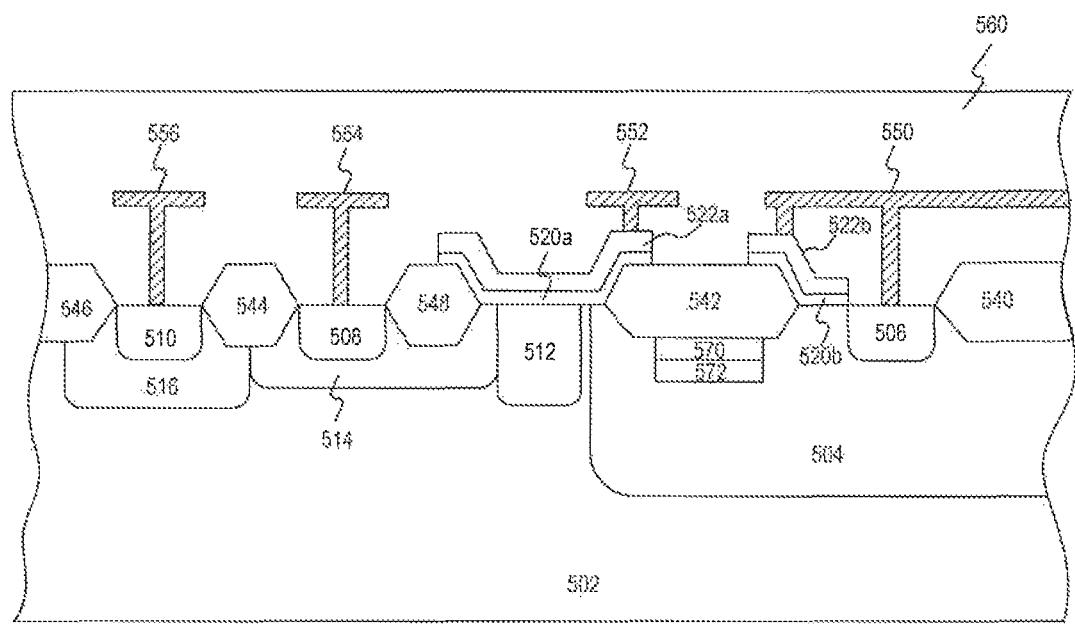

Referring to FIGS. 5A and 5B which respectively represent semiconductor devices 50A and 50B, devices 50A and 50B include all elements of devices 20A and 20B. In addition, each of devices 50A and 50B further includes an n-type doped region 570 and a p-type doped region 572, both of which are disposed in an n-type doped deep well 504, where region 570 is disposed above region 572. Regions 570 and 572 may increase breakdown voltage of devices 50A and 503 and at the same time to reduce the ON-resistance of the devices.

Referring to FIGS. 6A and 6B which respectively represent semiconductor devices 60A and 60B, devices 60A and 603 include all elements of devices 30A and 30B. In addition, each of devices 60A and 60B further includes an n-type doped region 670 and a p-type doped region 672, both of which are disposed in an n-type doped deep well 604, where region 670 is disposed above region 672. Regions 670 and 672 may increase breakdown voltage of devices 60A and 60B and at the same time to reduce the ON-resistance of the devices.

Figure 7A:
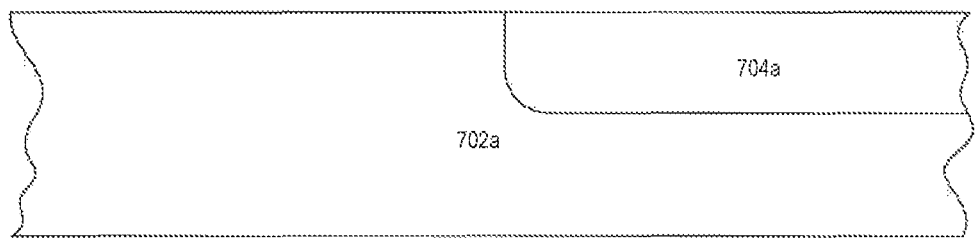

Next, example methods of manufacturing devices 10A and 10B will be described with FIGS. 7A-7L. Referring to FIG. 7A, an n-type doped deep well 704a is formed in a first semiconductor layer 702a. Deep well 704a may be formed by, for example, a combination of a lithography process and a doping process. For example, an area of deep well 704a may be defined or patterned by using a lithography process. The lithography-defined area of deep well 704a may be doped to achieve a certain doping concentration by using, for example, an implantation process. First semiconductor layer 702a may be a silicon wafer, silicon-containing substrate, or a layer of other semiconductor material.

Figure 7B:
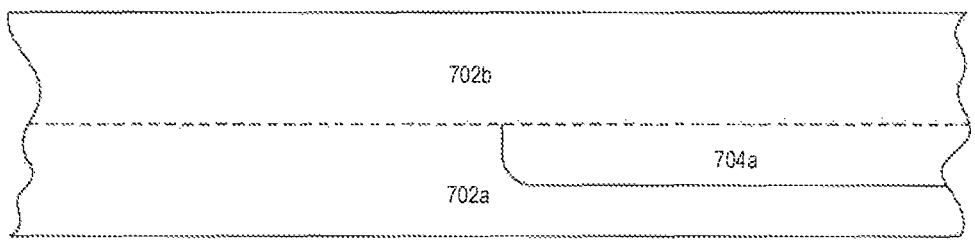

Referring to FIG. 7B, a second semiconductor layer 702b having a p-type conductivity is formed on first semiconductor layer 702a. Second semiconductor layer 702b may be formed using, for example, a chemical vapor deposition (CVD) process, an atomic layer deposition (ALD) process, a molecular beam epitaxy (MBE) process, a physical vapor deposition (PVD) process, or other suitable deposition processes. Second semiconductor layer 702b may, for example, be an epitaxial layer formed by using, for example, one of the aforementioned processes. P-type conductivity of second semiconductor layer 702b may be formed by using, for example, an in situ doping process when depositing second semiconductor layer 702b, an implantation process after depositing second semiconductor layer 702b, or other suitable doping techniques.

Figure 7C:
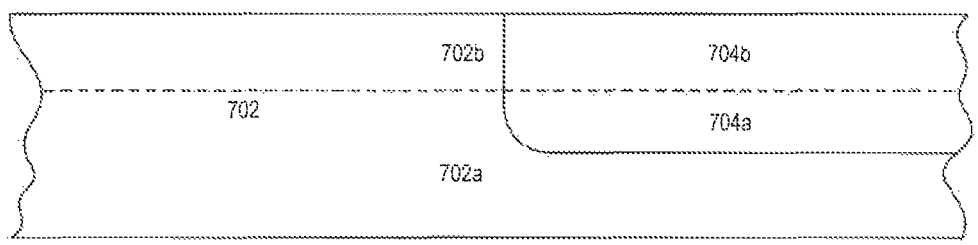

Referring to FIG. 7C, an n-type doped deep well 704b is formed in second semiconductor layer 702b. Deep well 704b may be formed by, for example, a combination of a lithography process and a doping process similar to those described above. Deep well 704b is formed such that 704a and 704b are combined into a single n-type doped deep well 704. It is noted that deep well 704 does not have to be formed by using a multi-step process described above (forming deep well 704a, forming layer 702b, and forming deep well 704b). Deep well 704 may be formed by using a single doping process. Similarly, semiconductor layer 702, which is a combination of layers 702a and 702b, does not have to be formed by using a multi-step process describe above (forming layer 702a, forming deep well 704a, and forming layer 702b). Layer 702 may be a semiconductor wafer, a single-layer semiconductor material, or a multi-layer semiconductor material.

Figure 7D:
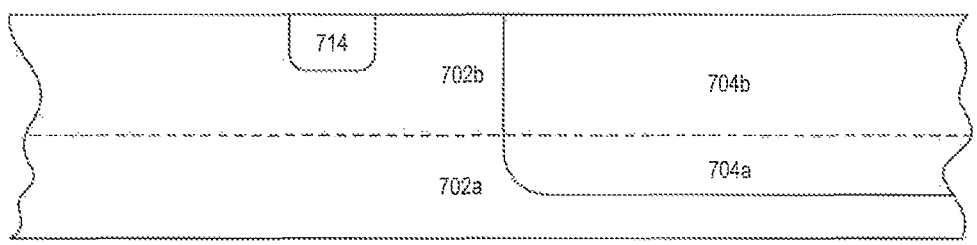

Referring to FIG. 7D, an n-type doped well 714 is formed in second semiconductor layer 702b apart from deep well 704b. Doping concentration of well 714 may be, for example, about 1e11 to 1e14 atoms/cm$^2$. Well 714 may be formed by, for example, a combination of a lithography process and a doping process similar to those described above.

Figure 7E:
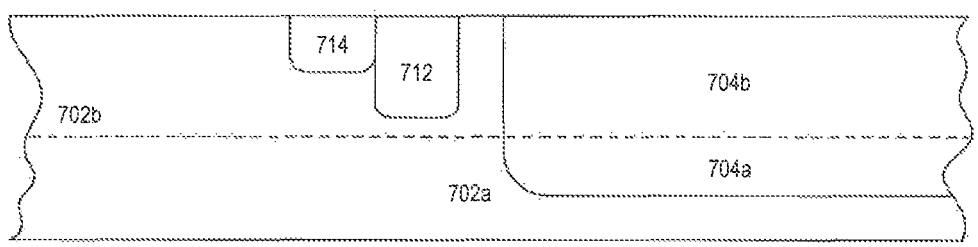

Referring to FIG. 7E, a first p-type doped region ("first region") 712 is formed in second semiconductor layer 702b and between deep well 704b and well 714. Doping concentration of first region 712 may be, for example, about 1e11 to 1e14 atoms/cm$^2$. Deep well 704b, first region 712, and well 714 may or may not be adjacent to each other. First region 712 may be formed by, for example, a combination of a lithography process and a doping process similar to those described above.

Figure 7F:
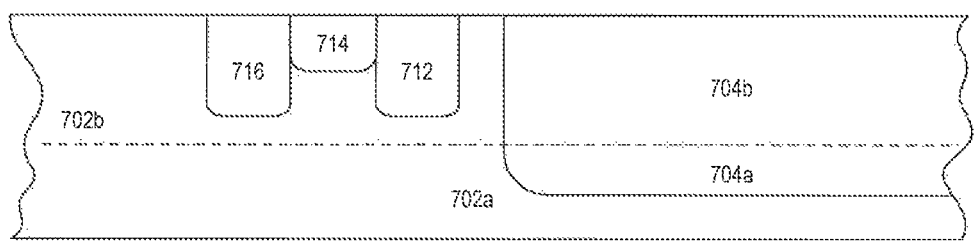

In some embodiments, referring to FIG. 7F, a second p-type doped region ("second region") 716 is formed in second semiconductor layer 702b, and is disposed apart from deep well 704b and first region 712. Second region 716 may or may not be adjacent to well 714. Doping concentrations of second region 716 may be, for example, about 1e11 to 1e14 atoms/cm$^2$. Second region 716 may be formed by, for example, a combination of a lithography process and a doping process similar to those described above. Second region 716 may be formed before or after forming first region 712. Alternatively, first region 712 and second region 716 may be formed concurrently. Moreover, doping concentrations of first region 712 and second region 716 may or may not be the same. In some embodiments, the doping concentration of first region 712 or second region 716 may be adjusted by a subsequent doping process to achieve a desired doping concentration.

Devices 10A and 10B, as shown in FIGS. 1A and 1B respectively, differ with regard to the presence of second region 716. Device 10A does not include region 716, while device 10B does. Thus, device 10A may be manufactured by using example methods described in view of FIGS. 7A-7E, and then followed by using example methods described in view of FIGS. 7G-7L that will be described below. On the other hand, device 10B may be manufactured by using example methods described in view of FIGS. 7A-7F, and then followed by example methods in view of FIGS. 7G-7L.

Figure 7G:
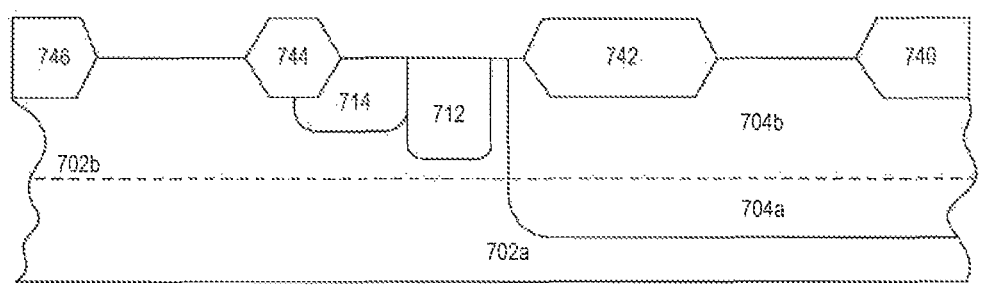

Referring to FIG. 7G, isolations 740, 742, 744, and 746 are formed in second semiconductor layer 702b to, for example, isolate source, drain, and body regions that will be formed later in the example process methods. Isolations 740, 742, 744, and 746 may be formed by using, for example, a shallow trench isolation (STI) process, a Local Oxidation of Silicon (LOCOS) process, or other suitable techniques to provide isolations. STI and LOCOS processes are known in the art of semiconductor fabrication and are not described further in detail in this disclosure.

Figure 7H:
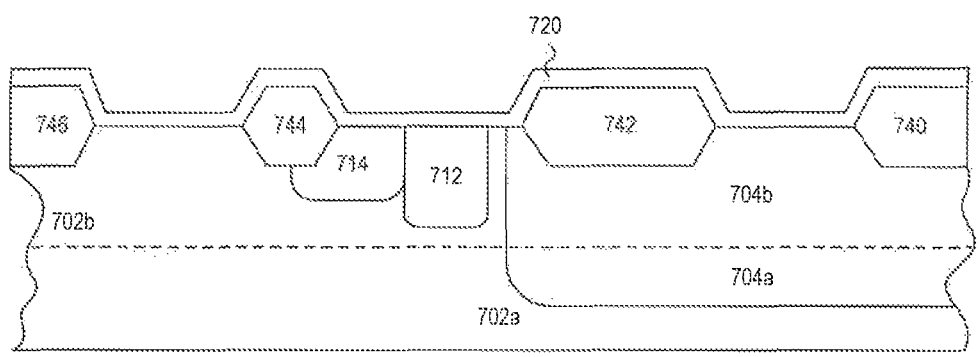

Referring to FIG. 7H, an insulator 720 is formed on second semiconductor layer 702b, and isolations 740, 742, 744, and 746. Insulator 720 may be formed by, for example, oxidizing second semiconductor layer 702b, or by depositing an insulator material by using a CVD process, an ALD process, a MBE process, a PVD process, or other suitable deposition processes. In some embodiments, insulator 720 may, for example, be patterned by a combination of lithography and etch processes. By using a lithography process, a resist layer that is disposed on as-deposited or as-formed insulator layer may be patterned to expose areas of the insulator layer to be removed subsequently. In the etch process, the exposed areas of the insulator layer are removed such that insulator 720 is disposed only on certain designated areas (not shown).

Figure 7I:
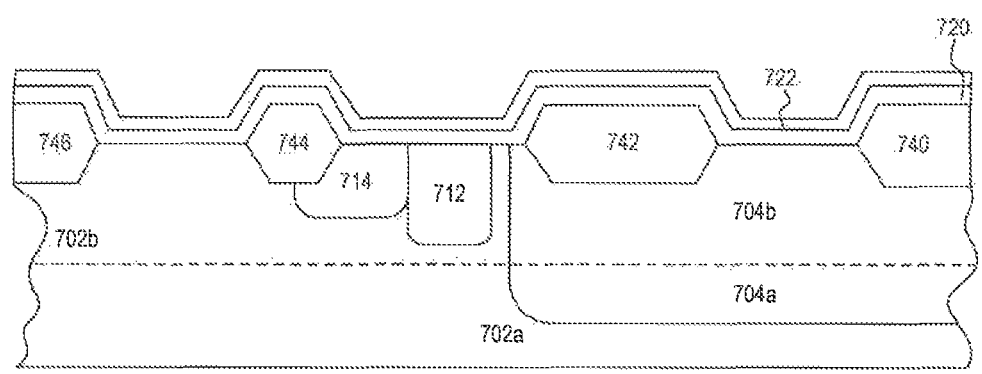

Referring to FIG. 7I, in some embodiments, a conductive member 722 is formed on insulator 720. Conductive member 722 may be formed by, for example, depositing a semiconductor material or a conductive material using CVD, ALD, MBE, PVD, or other suitable techniques. In some embodiments, conductive member 722 may, for example, be patterned by a combination of lithography and etch processes similar to those described above such that conductive member 722 is disposed only on certain designated areas (not shown).

Figure 7J:
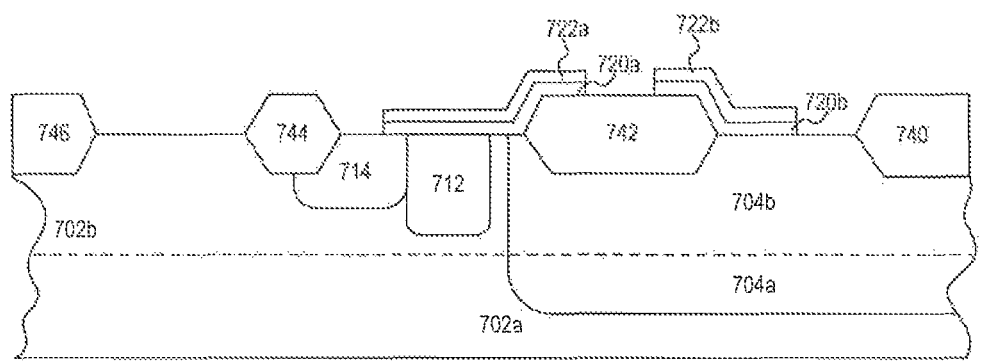

Referring to FIG. 7J, in some embodiments, insulator 720 and conductive member 722 may, for example, be patterned in the same process flow by a combination of lithography and etch processes similar to those described above such that a stack of insulator 720 and conductive member 722 is disposed only on certain designated areas. For example, a stack of insulator 720a and conductive member 722a may be disposed on second semiconductor layer 702b. Additionally or alternatively, a stack of insulator 720b and conductive member 722b may be disposed on second semiconductor layer 702b. In some embodiments, the stack of insulator 720a and conductive member 722a, and the stack of insulator 720b and conductive member 722b may be formed concurrently. In some embodiments, conductive member 722a and insulator 720a, or conductive member 722b and insulator 720b may extend onto isolation 742. The extended portion of conductive member 722a or 722b may, for example, function as a field plate to reduce the local electric field and increase breakdown voltage of the device.

Figure 7K:
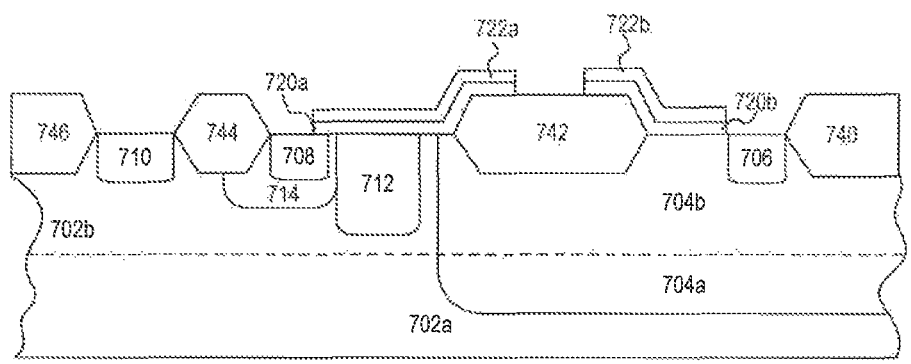

Referring to FIG. 7K, an n-type drain region 706 is formed in deep well 704b and between isolations 740 and 742. Additionally, an n-type source region 708 is formed in well 714. In addition, a p-type doped body region 710 is formed in second semiconductor layer 702b (for device 10A). Alternatively, body region 710 is formed in second region 716 (not shown, for device 10B. See FIG. 7F for second region 716). Body region 710 is disposed between isolations 744 and 746. Drain region 706 and source region 708 may or may not be formed concurrently. Body region 710 may be formed before or after forming drain region 706 or source region 708. Drain region 706, source region 708, or body region 710 may be formed by, for example, a combination of a lithography process and a doping process. For example, an area of drain region 706, source region 708, or body region 710 may be defined or patterned by using a lithography process. The lithography-defined area of the aforementioned region may be doped to achieve a desired doping type or concentration by, for example, using an implantation process. In some embodiments, the implantation process for drain region 706, source region 708, or body region 710 may include implanting dopants into conductive member 722a or 722b for modifying conductivity of the same.

Referring to FIG. 7L, electrodes 750, 752, 754, and 756 are formed to electrically connect drain region 706, conductive member 722a, source region 708, and body region 710 respectively. In some embodiments, electrode 750 may be formed to electrically connect conductive member 722b and drain region 706. In some embodiments, an interlayer dielectric layer 760 is formed to encapsulate the device. Electrodes 750, 752, 754, 756, and interlayer dielectric layer 760 may be formed using a back-end-of-the-line (BEOL) process. The BEOL process is known in the art of semiconductor fabrication and is not described in further detail in this disclosure.

Devices 40A and 40B, as illustrated in FIGS. 4A and 4B respectively, may be manufactured by using the example process methods described above and by further including formation processes of regions 470 and 472. Regions 470 and 472 may be formed by using, for example, an implantation process or other suitable doping process, similar to those described in view of FIGS. 7D-7F.

Figure 8A:
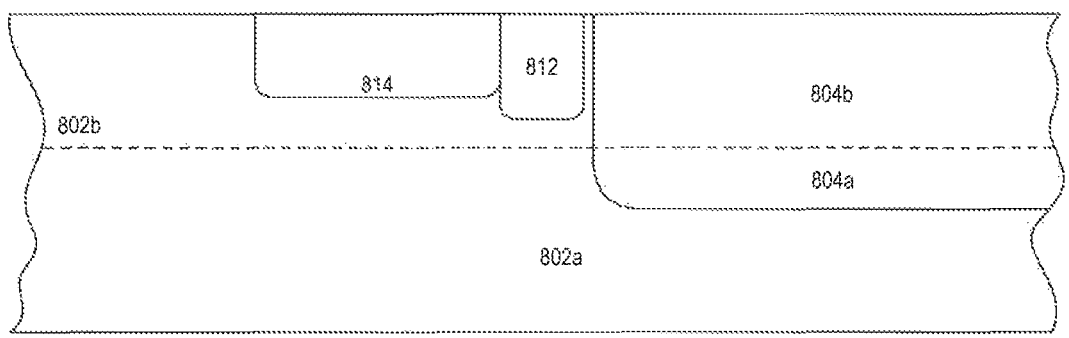
FIGS. 8A-8H show example methods of manufacturing the devices of FIGS. 2A, 2B, 5A, and 5B.

Next, example methods of manufacturing devices 20A and 20B will be described with corresponding figures. Starting from the structure illustrated in FIG. 7D, as illustrated in FIG. 8A, a first p-type doped region ("first region") 812 is formed in a second semiconductor layer 802b and between an n-type doped deep well 804b and an n-type doped well 814. Doping concentration of first region 812 may be, for example, about 1e11 to 1e14 atoms/cm². Deep well 804b, first region 812, and well 814 may or may not be adjacent to each other. First region 812 may be formed by, for example, a combination of a lithography process and a doping process similar to those described above.

Figure 8B:
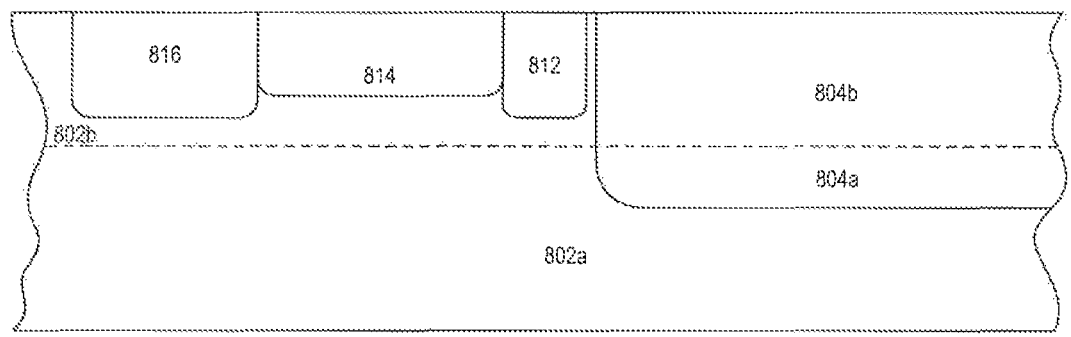

In some embodiments, referring to FIG. 8B, a second p-type doped region ("second region") 816 is formed in second semiconductor layer 802b, and is disposed apart from deep well 804b and first region 812. Second region 816 may or may not be adjacent to well 814. Doping concentrations of second region 816 may be, for example, about 1e11 to 1e14 atoms/cm². Second region 816 may be formed by, for example, a combination of a lithography process and a doping process similar to those described above. Second region 816 may be formed before or after forming first region 812. Alternatively, first region 812 and second region 816 may be formed concurrently. Moreover, doping concentrations of first region 812 and second region 816 may or may not be the same. In some embodiments, the doping concentration of first region 812 or second region 816 may be adjusted by a subsequent doping process to achieve a desired doping concentration.

Devices 20A and 20B, as shown in FIGS. 2A and 2B respectively, differ with regard to the presence of second region 816. Device 20A does not include second region 816, while device 20B does. Thus, device 20A may be manufactured by using example methods described in view of FIG. 8A, and then followed by using example methods described in view of FIGS. 8C-8H that will be described below. On the other hand, device 20B may be manufactured by using example methods described in view of FIG. 8B, and then followed by using example methods in view of FIGS. 8C-8H.

Figure 8C:
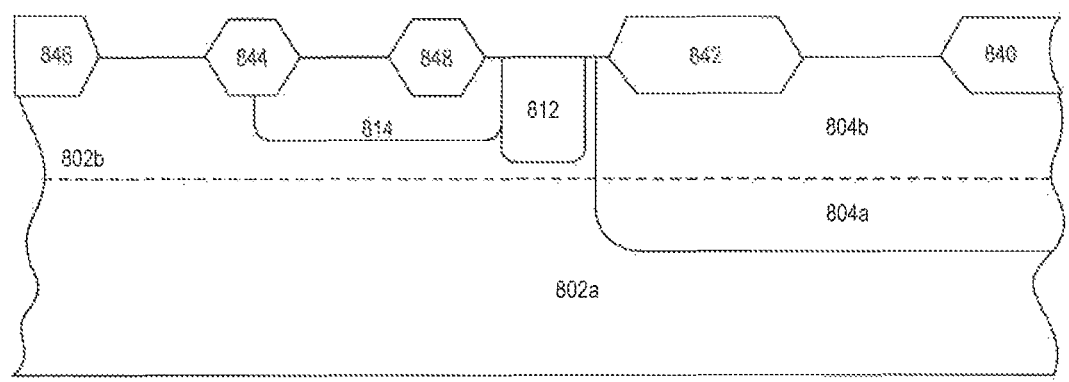

Referring to FIG. 8C, isolations 840, 842, 844, 846, and 848 are formed in second semiconductor layer 802b. Isolations 840, 842, 844, and 846 are formed, for example, to isolate source, drain, and body regions that will be formed later in the example process methods. Isolation 848 is formed, for example, to support a field plate structure that will be formed in subsequent process steps. Isolations 840, 842, 844, 846, and 848 may be formed by using, for example, a shallow trench isolation (STI) process, a Local Oxidation of Silicon (LOCOS) process, or other suitable techniques, to provide electrical isolation, STI and LOCOS processes are known in the art of semiconductor fabrication and are not described further in detail in this disclosure.

Figure 8D:
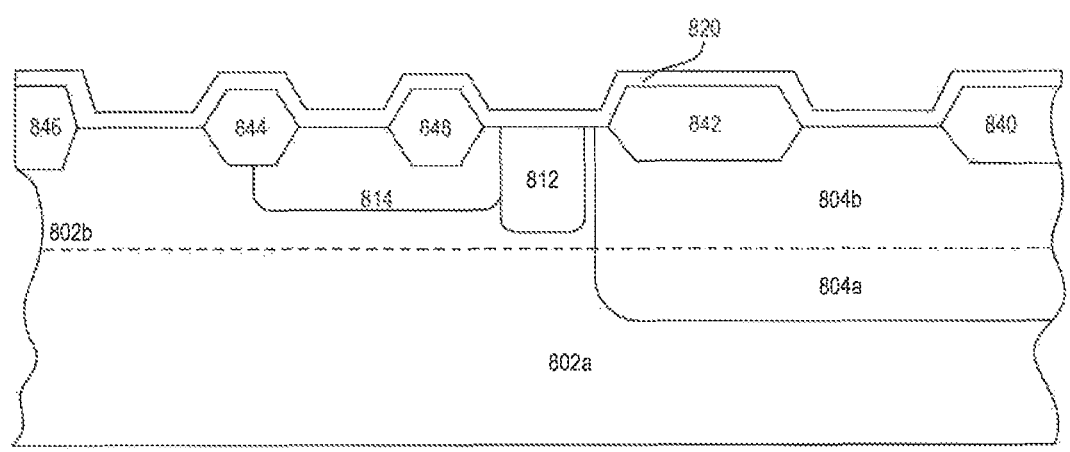

Referring to FIG. 8D, an insulator 820 is formed on second semiconductor layer 802b, and isolations 840, 842, 844, 846, and 848. Insulator 820 may be formed by, for example, oxidizing second semiconductor layer 802b, or by depositing an insulator material by using a CVD process, an ALD process, a MBE process, a PVD process, or other suitable deposition processes. Insulator 820 may, for example, be patterned by a combination of lithography and etch processes similar to those described above. In some embodiments, insulator 820 may, for example, be patterned by a combination of lithography and etch processes. By using a lithography process, a resist layer that is disposed on as-deposited or as-formed insulator layer may be patterned to expose areas of the insulator layer to be removed subsequently. In the etch process, the exposed areas of the insulator layer are removed such that insulator 820 is disposed only on certain designated areas (not shown).

Figure 8E:
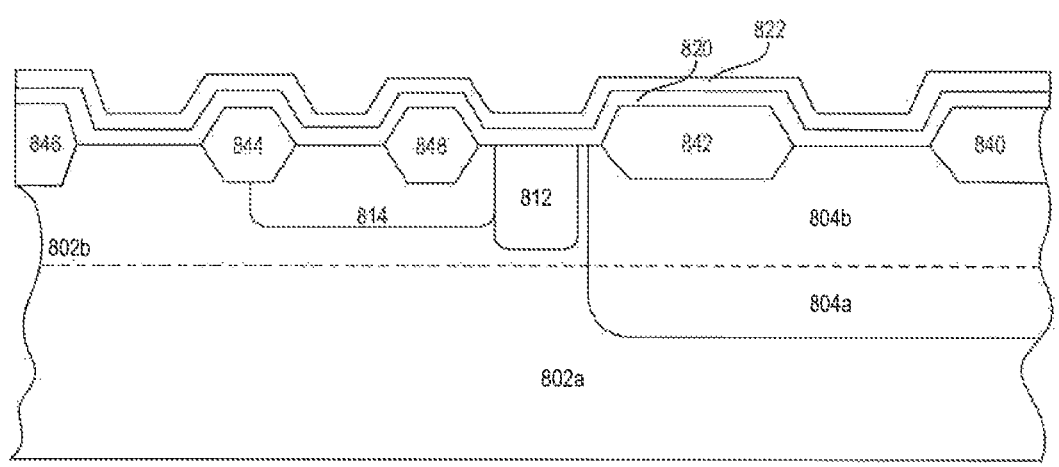

Referring to FIG. 8E, in some embodiments, a conductive member 822 is formed on insulator 820. Conductive member 822 may be formed by, for example, depositing a semiconductor material or a conductive material using CVD, ALD, MBE, PVD, or other suitable techniques. In some embodiments, conductive member 822 may, for example, be patterned by a combination of lithography and etch processes similar to those described above such that conductive member 822 is disposed only on certain designated areas (not shown).

Figure 8F:
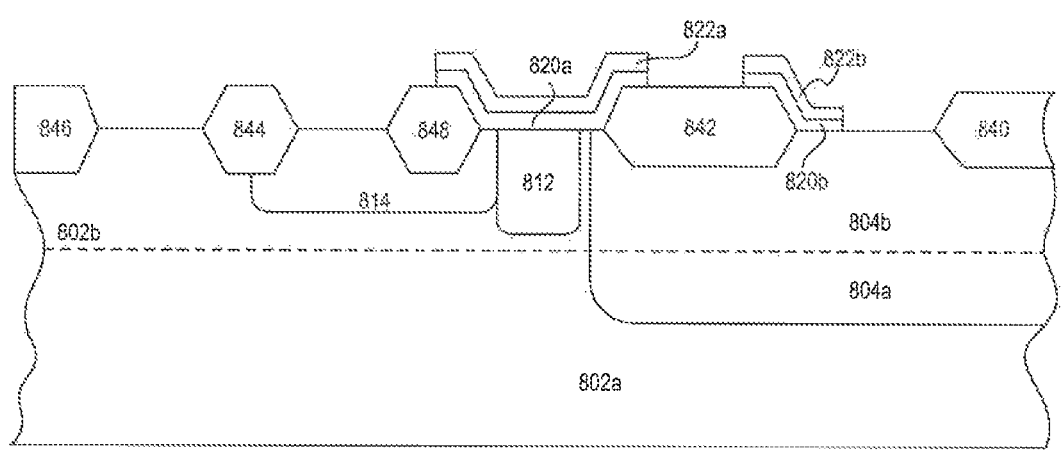

Referring to FIG. 8F, in some embodiments, insulator 820 and conductive member 822 may, for example, be patterned in the same process flow by a combination of lithography and etch processes similar to those described above such that a stack of insulator 820 and conductive member 822 is disposed only on certain designated areas. For example, a stack of insulator 820a and conductive member 822a may be disposed on second semiconductor layer 802b. Additionally or alternatively, a stack of insulator 820b and conductive member 822b may be disposed on second semiconductor layer 802b. In some embodiments, the stack of insulator 820a and conductive member 822a, and the stack of insulator 820b and conductive member 822b may be formed concurrently. In some embodiments, conductive member 822a and insulator 820a, or conductive member 822b and insulator 820b may extend onto isolation 842. Moreover, in some embodiments, the stack of conductive member 822a and insulator 820a may extend onto isolation 848. The extended portion of conductive member 822a or 822b may, for example, function as a field plate to reduce the local electric field and increase breakdown voltage of the device.

Figure 8G:
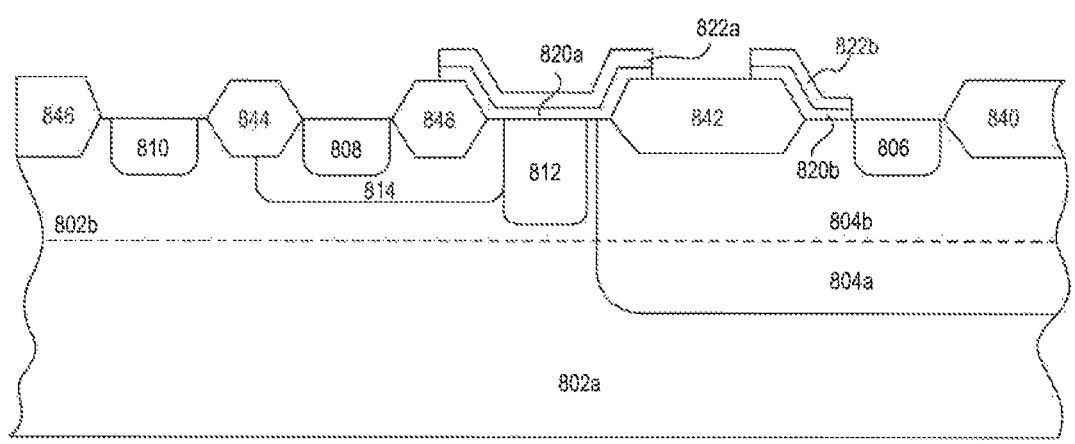
Figure 8H:
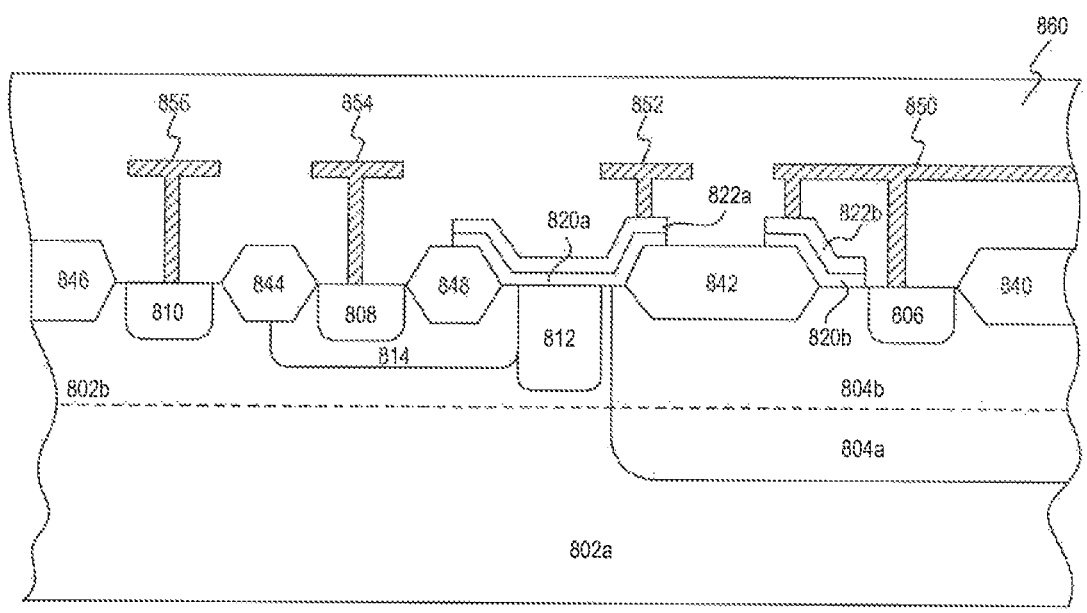

By following the example process methods similar to those described in view of FIGS. 7K and 7L (forming source, drain, and body region; and forming electrodes and an interlayer dielectric layer), as illustrated in FIGS. 8G and 8H, devices 20A or 20B may be manufactured.

Devices 50A and 50B, as illustrated in FIGS. 5A and 5B respectively, may be manufactured by using the example process methods described above and by further including formation processes of regions 570 and 572. Regions 570 and 572 may be formed by using, for example, an implantation process or other suitable doping process similar to those described in view of FIGS. 7D-7F.

Figure 9A:
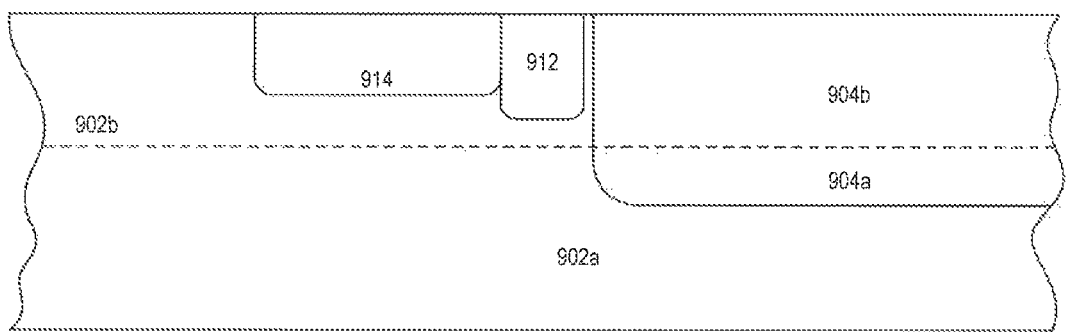
FIGS. 9A-9H show example methods of manufacturing the devices of FIGS. 3A, 3B, 6A, and 6B.

Next, example methods of manufacturing devices 30A and 30B will be described with corresponding figures. Starting from the structure illustrated in FIG. 7D, as illustrated in FIG. 9A, a first p-type doped region ("first region") 912 is formed in a second semiconductor layer 902b and between an n-type doped deep well 904b and an n-type doped well 914. Doping concentration of first region 912 may be, for example, about 1e11 to 1e14 atoms/cm$^2$. Deep well 904b, first region 912, and well 914 may or may not be adjacent to each other. First region 912 may be formed by, for example, a combination of a lithography process and a doping process similar to those described above.

Figure 9B:
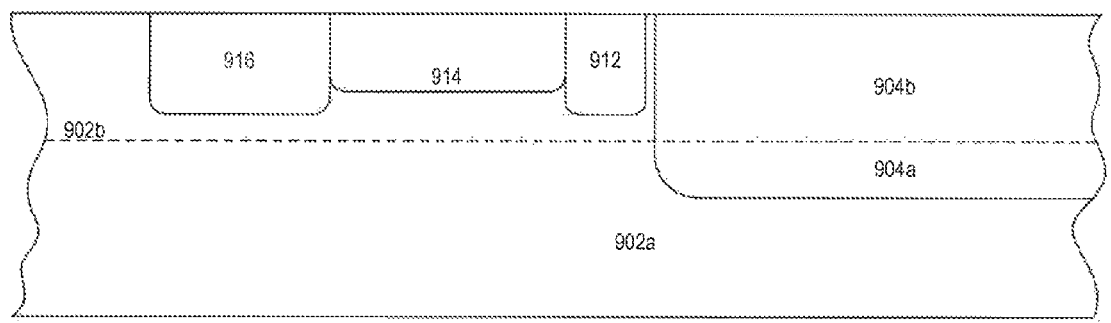

In some embodiments, referring to FIG. 9B, a second p-type doped region ("second region") 916 is formed in second semiconductor layer 902b, and is disposed apart from deep well 904b and first region 912. Second region 916 may or may not be adjacent to well 914. Doping concentrations of second region 916 may be, for example, about 1e11 to 1e14 atoms/cm$^2$. Second region 916 may be formed by, for example, a combination of a lithography process and a doping process similar to those described above. Second region 916 may be formed before or after forming first region 912. Alternatively, first region 912 and second region 916 may be formed concurrently. Moreover, doping concentrations of first region 912 and second region 916 may or may not be the same. In some embodiments, the doping concentration of first region 912 or second region 916 may be adjusted by a subsequent doping process to achieve a desired doping concentration.

Devices 30A and 30B, as shown in FIGS. 3A and 3B, differ with regard to the presence of second region 916. Device 30A does not include second region 916, while device 30B does. Thus, device 30A may be manufactured by using example methods described in view of FIG. 9A, and then followed by example methods described in view of FIGS. 9C-9H that will be described below. On the other hand, device 30B may be manufactured by using example methods described in view of FIG. 9B, and then followed by example methods in view of FIGS. 9C-9H.

Figure 9C:
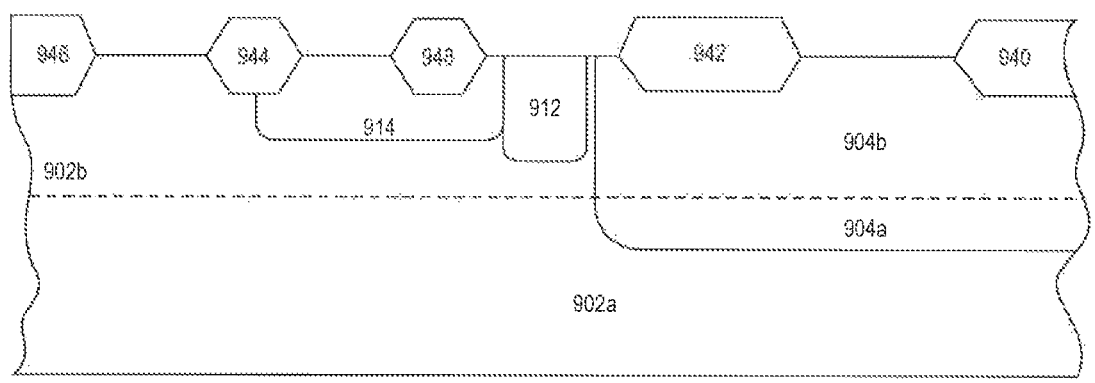

Referring to FIG. 9C, isolations 940, 942, 944, 946, and 948 are formed in second semiconductor layer 902b. Isolations 940, 942, 944, and 946 are formed, for example, to isolate source, drain, and body regions that will be formed later in the example process methods. Isolation 948 is formed, for example, to support a field plate structure that will be formed in subsequent process steps. Isolations 940, 942, 944, 946, and 948 may be formed by using, for example, a shallow trench isolation (STI) process, a Local Oxidation of Silicon (LOCOS) process, or other suitable techniques to provide isolations. STI and LOCOS processes are known in the art of semiconductor fabrication and are not described further in detail in this disclosure.

Figure 9D:
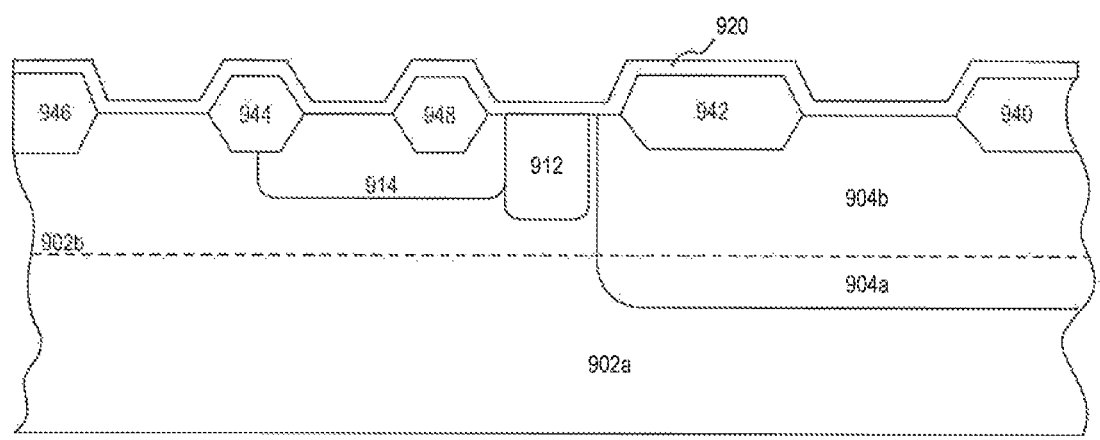

Referring to FIG. 9D, insulator 920 is formed on second semiconductor layer 902*b*, and isolations 940, 942, 944, 946, and 948. Insulator 920 may be formed by, for example, oxidizing second semiconductor layer 902*b*, or by depositing an insulator material by using a CVD process, an ALD process, a MBE process, a PVD process, or other suitable deposition processes. In some embodiments, insulator 920 may, for example, be patterned by a combination of lithography and etch processes similar to those described above such that insulator 920 is disposed only on certain designated areas (not shown).

Figure 9E:
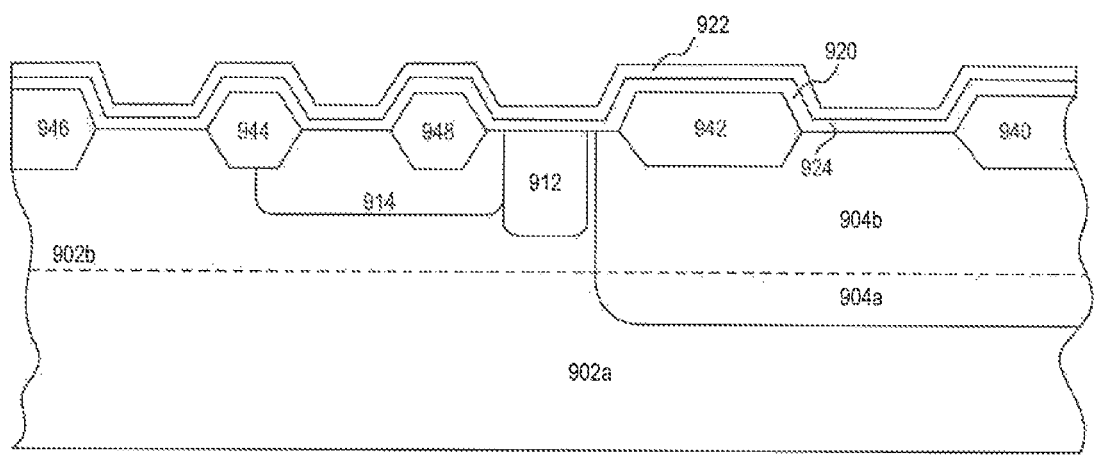

Referring to FIG. 9E, in some embodiments, a conductive member 922 is formed on insulator 920. Conductive member 922 may be formed by, for example, depositing a semiconductor material or a conductive material using CVD, ALD, MBE, PVD, or other suitable techniques. Conductive member 922 may, for example, be patterned by a combination of lithography and etch processes similar to those described above such that conductive member 922 is disposed only on certain designated areas (not shown).

Figure 9F:
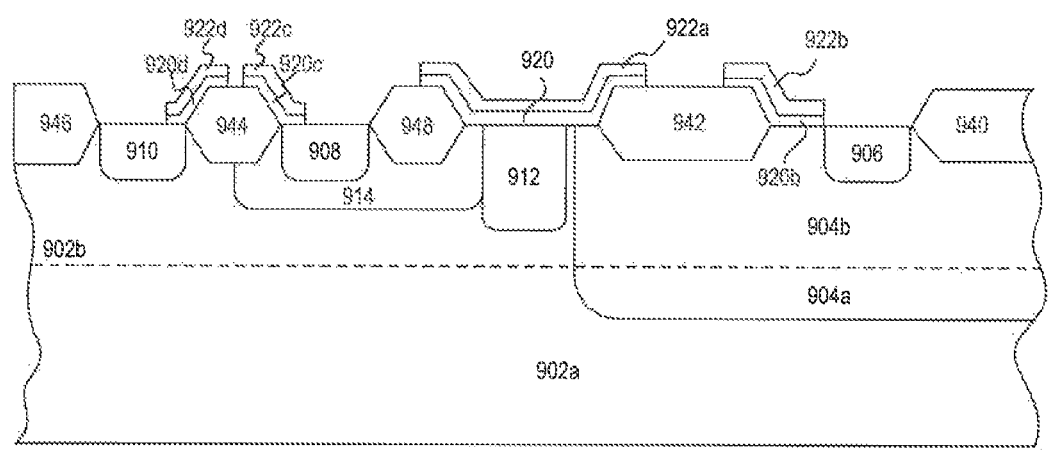

Referring to FIG. 9F, in some embodiments, insulator 920 and conductive member 922 may, for example, be patterned in the same process flow by a combination of lithography and etch processes similar to those described above such that a stack of insulator 920 and conductive member 922 is disposed only on certain designated areas. For example, a stack of insulator 920*a* and conductive member 922*a* may be disposed on second semiconductor layer 902*b*. Additionally or alternatively, a stack of insulator 920*b* and conductive member 922*b* may be disposed on second semiconductor layer 902*b*. In some embodiments, the stack of insulator 920*a* and conductive member 922*a*, and the stack of insulator 920*b* and conductive member 922*b* may be formed concurrently. In some embodiments, conductive member 922*a* and insulator 920*a*, or conductive member 922*b* and insulator 920*b* may extend onto isolation 942. Moreover, in some embodiments, the stack of conductive member 922*a* and insulator 920*a* may extend onto isolation 948. In some embodiments, a stack of insulator 920*c* and conductive member 922*c*, or a stack of insulator 920*d* and conductive member 922*d* may be formed on second semiconductor layer 902*b*. In some embodiments, the stack of insulator 920*c* and conductive member 922*c*, or the stack of insulator 920*d* and conductive member 922*d* may extend onto isolation 944. The extended portion of conductive member 922*a*, 922*b*, 922*c*, or 922*d* may, for example, function as a field plate to reduce the local electric field and increase breakdown voltage of the device.

Figure 9G:
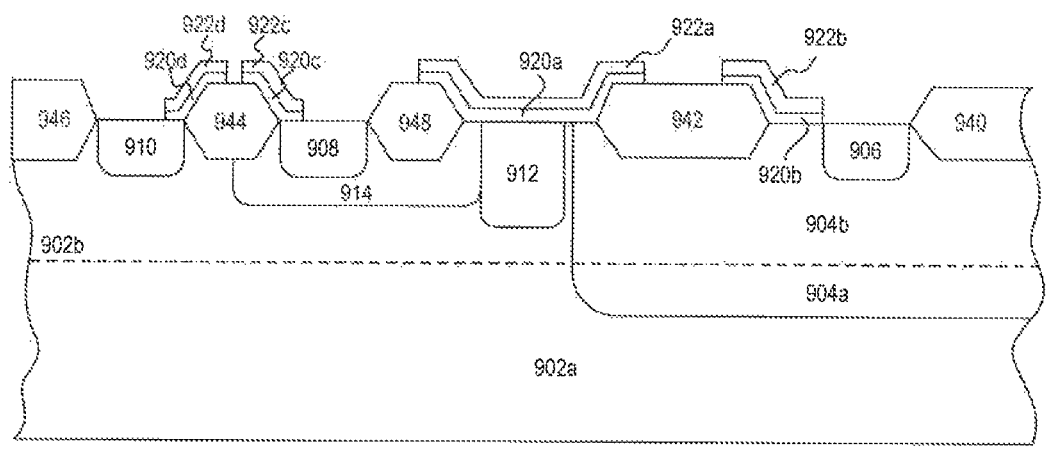
Figure 9H:
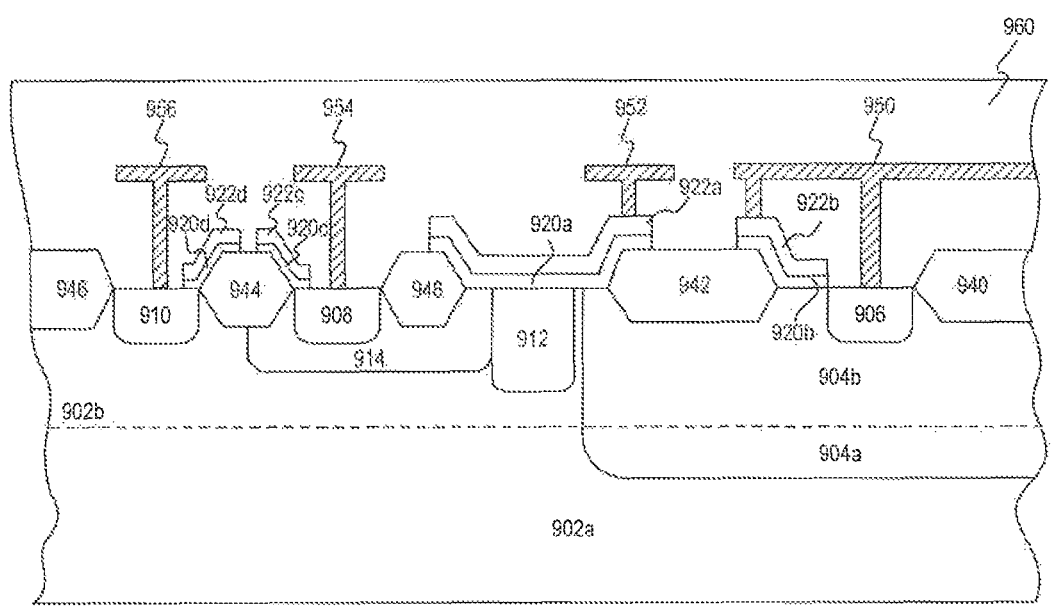

By following the processes similar to those discussed in view of FIGS. 7K and 7L, as illustrated in FIGS. 9G and 9H, device 30A or 30B may be manufactured.

Devices 60A and 60B, as illustrated in FIGS. 6A and 6B respectively, may be manufactured by using the example process methods described above and by further including formation processes of regions 670 and 672. Regions 670 and 672 may be formed by using, for example, an implantation process or other suitable doping process similar to those described in view of FIGS. 7D-7F.

The doping type for each of the doped wells, members, and regions may be changed, for example, from n-type to p-type or p-type to n-type, to create devices having a doping type complementary to the devices described above.

Certain adaptations and modifications of the described embodiments can be made. Therefore, the above-discussed embodiments are considered to be illustrative and not restrictive.

What is claimed is:

1. A semiconductor device comprising:
   a semiconductor layer;
   a doped well disposed in the semiconductor layer and having a first conductivity type;
   a drain region disposed in the doped well;
   a source region and a body region disposed in the semiconductor layer;
   a first doped region having a second conductivity type, the first doped region being disposed between the source region and the doped well, and a lower portion of the first doped region being in contact with the semiconductor layer;
   a second doped region having the first conductivity type, the second doped region being disposed under the source region and between the source region and the first doped region, and a lower portion of the second doped region being in contact with the semiconductor layer;
   a third doped region having the second conductivity type and disposed in the doped well; and
   a fourth doped region disposed in the doped well and above the third doped region, the fourth doped region having the first conductivity type.

2. The semiconductor device according to claim 1, further comprising
   a fifth doped region having the second conductivity type and disposed under the body region.

3. The semiconductor device according to claim 2, wherein
   the first doped region and the fifth doped region have substantially the same doping concentration.

4. The semiconductor device according to claim 2, wherein the first doped region and the fifth doped region have different doping concentrations.

5. The semiconductor device according to claim 1, further comprising
   a field plate connected to at least one of the source region, the drain region, or the body region.

6. The semiconductor device according to claim 2, further comprising
   a field plate connected to at least one of the source region, the drain region, or the body region.

7. The semiconductor device according to claim 1, further comprising
   an insulator disposed on the first doped region; and
   a conductive member disposed on the insulator.

8. The semiconductor device according to claim 7, further comprising
   a field plate connected to the conductive member.

9. The semiconductor device according to claim 2, further comprising
   an insulator disposed on the first doped region; and
   a conductive member disposed on the insulator.

10. The semiconductor device according to claim 9, further comprising
    a field plate connected to the conductive member.

11. A semiconductor device comprising:
    a semiconductor layer;
    a doped well disposed in the semiconductor layer and having a first conductivity type;
    a drain region disposed in the doped well;
    a source region and a body region disposed in the semiconductor layer;
    a first doped region having a second conductivity type, the first doped region being disposed between the source region and the doped well, and a lower portion of the first doped region being in contact with the semiconductor layer; and a second doped region having the first conductivity type, the second doped region being disposed under the source region and between the source region and the first doped region, and a lower portion of the second doped region being in contact with the semiconductor layer.

12. The semiconductor device according to claim 11, further comprising a third doped region having the second conductivity type and disposed under the body region.

13. The semiconductor device according to claim 12, wherein the first doped region and the third doped region have substantially the same doping concentration.

14. The semiconductor device according to claim 12, wherein the first doped region and the third doped region have different doping concentrations.

15. The semiconductor device according to claim 11, further comprising a field plate connected to at least one of the source region, the drain region, or the body region.

16. The semiconductor device according to claim 12, further comprising a field plate connected to at least one of the source region, the drain region, or the body region.

17. The semiconductor device according to claim 11, further comprising an insulator disposed on the first doped region; and a conductive member disposed on the insulator.

18. The semiconductor device according to claim 17, further comprising a field plate connected to the conductive member.

19. The semiconductor device according to claim 12, further comprising an insulator disposed on the first doped region; and a conductive member disposed on the insulator.

20. The semiconductor device according to claim 19, further comprising a field plate connected to the conductive member.

* * * * *